(12) United States Patent
Kim et al.

(10) Patent No.: US 9,368,759 B2
(45) Date of Patent: Jun. 14, 2016

(54) DISPLAY DEVICE

(71) Applicant: Samsung Display Co., Ltd., Yongin, Gyeonggi-Do (KR)

(72) Inventors: Sung-Chul Kim, Yongin (KR); Jae-Myong Yoo, Yongin (KR); Ung-Sik Kim, Yongin (KR); Tae-Soo Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 279 days.

(21) Appl. No.: 13/659,081

(22) Filed: Oct. 24, 2012

(65) Prior Publication Data

US 2013/0300680 A1    Nov. 14, 2013

(30) Foreign Application Priority Data

May 8, 2012    (KR) .......................... 10-2012-0048719

(51) Int. Cl.
*G06F 3/041* (2006.01)
*H01L 51/52* (2006.01)
*H01L 27/32* (2006.01)

(52) U.S. Cl.
CPC .......... *H01L 51/5281* (2013.01); *H01L 27/323* (2013.01)

(58) Field of Classification Search
USPC .......................................................... 345/173
See application file for complete search history.

(56) References Cited

U.S. PATENT DOCUMENTS

| | | | |
|---|---|---|---|
| 6,020,945 A * | 2/2000 | Sawai et al. .................... | 349/119 |
| 6,411,344 B2 * | 6/2002 | Fujii et al. ........................ | 349/12 |
| 6,611,299 B1 * | 8/2003 | Fujii et al. ........................ | 349/12 |
| 7,106,307 B2 | 9/2006 | Cok | |
| 7,936,338 B2 | 5/2011 | Iwase | |
| 8,148,894 B2 | 4/2012 | Park et al. | |
| 2005/0127820 A1 * | 6/2005 | Yamazaki et al. ............. | 313/501 |
| 2007/0279556 A1 * | 12/2007 | Wang et al. .................... | 349/102 |
| 2008/0258614 A1 * | 10/2008 | Ha et al. ........................ | 313/504 |
| 2009/0002580 A1 * | 1/2009 | Matsushima et al. ........... | 349/12 |
| 2009/0213092 A1 | 8/2009 | Kuo et al. | |
| 2010/0052521 A1 | 3/2010 | Kim et al. | |
| 2010/0156282 A1 * | 6/2010 | Park et al. ...................... | 313/504 |
| 2011/0012839 A1 | 1/2011 | Lin | |
| 2011/0069014 A1 | 3/2011 | Huang et al. | |
| 2011/0175123 A1 | 7/2011 | Koh et al. | |
| 2012/0056211 A1 * | 3/2012 | Kitagawa et al. ............... | 257/88 |
| 2012/0105956 A1 * | 5/2012 | Jeong et al. .............. | 359/488.01 |

FOREIGN PATENT DOCUMENTS

| | | |
|---|---|---|
| JP | 2011138144 | 7/2011 |
| KR | 1020100025227 | 3/2010 |
| KR | 1020110084771 | 7/2011 |

* cited by examiner

*Primary Examiner* — Jason Olson
*Assistant Examiner* — Sosina Abebe
(74) *Attorney, Agent, or Firm* — Robert E. Bushnell, Esq.

(57) ABSTRACT

A display device includes a display unit for displaying an image, a first retarder provided on the display panel, a first polarizing plate provided on the first retarder, a touch unit provided on the first polarizing plate, a second retarder provided on the touch unit, and a second polarizing plate provided on the second retarder. With this arrangement, external light entering into the display may either be transmitted or reflected off of the touch unit, and in either case, be absorbed by the second polarizing plate without leaving the display device.

20 Claims, 8 Drawing Sheets

DISPLAY DEVICE

CROSS-REFERENCE TO RELATED APPLICATION

This application claims priority to and the benefit of Korean Patent Application No. 10-2012-0048719 filed in the Korean Intellectual Property Office on May 8, 2012, the entire contents of which are incorporated herein by reference.

BACKGROUND OF THE INVENTION

1. Field of the Invention

The present invention relates to a display device. More particularly, the present invention relates to a display device including a display unit for displaying images and a touch unit for sensing touches.

2. Description of the Related Art

Display devices display images, and recently, an organic light emitting diode display has been in the spotlight.

The organic light emitting diode display has a self-emitting characteristic and does not need a separate light source such that the thickness and weight thereof are decreased, unlike a liquid crystal display. In addition, the organic light emitting diode display has high-grade characteristics such as low power consumption, high luminance, high reaction speed, and the like.

In general, an organic light emitting diode (OLED) display includes a display unit that is an organic light emitting diode including a first electrode, an organic emission layer, and a second electrode that are sequentially stacked, and metal wires such as the first electrode and the second electrode included in the display unit can reflect light provided from the outside. Therefore, when the organic light emitting diode (OLED) display is used in a bright area, reflection of external light worsens expression of black and contrast.

Recently, an organic light emitting diode (OLED) display having a capacitive touch unit on the display unit has been used, the touch unit includes metal wires for sensing touch motions, and the metal wires reflect the light that is provided from the outside, so when the organic light emitting diode (OLED) display is used in a bright place, the reflection of external light deteriorates expression of black and contrast.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a display device for controlling reflection of external light while being inclusive of a display unit and a touch unit.

An exemplary embodiment of the present invention provides a display device including a display unit to display an image, a first retarder arranged on the display panel, a first polarizing plate arranged on the first retarder, a touch unit arranged on the first polarizing plate, a second retarder arranged on the touch unit and a second polarizing plate arranged on the second retarder. The display unit may include a first electrode, an organic emission layer, and a second electrode that are sequentially stacked.

The first retarder may be a ¼ wave plate, and the second retarder may be a ½ wave plate. An intersection angle between a polarization axis of the second polarizing plate and a polarization axis of the first polarizing plate may be 90 degrees, an intersection angle between an optical axis of the second retarder and an optical axis of the first retarder may be 90 degrees, and an intersection angle between the optical axis of the first retarder and the polarization axis of the first polarizing plate may be 45 degrees. The polarization axis of the second polarizing plate may be a predetermined 0 degrees, the optical axis of the second retarder may have an angle of (θ+45) degrees, the polarization axis of the first polarizing plate may have an angle of (θ+90) degrees, and the optical axis of the first retarder may have an angle of (θ+90)+45 degrees.

Alternatively, an intersection angle between a polarization axis of the second polarizing plate and a polarization axis of the first polarizing plate may be 90 degrees, an intersection angle between an optical axis of the second retarder and an optical axis of the first retarder may be 0 degrees, and an intersection angle between an optical axis of the first retarder and a polarization axis of the first polarizing plate may be −45 degrees. In this case, the polarization axis of the second polarizing plate may be a predetermined θ degrees, the optical axis of the second retarder may have an angle of (θ+45) degrees, the polarization axis of the first polarizing plate may have an angle of (θ+90) degrees, and the optical axis of the first retarder may have an angle of (θ+90)−45 degrees.

The display device may instead include an adhesive layer between the first polarizing plate and the touch unit. A refractive index of the adhesive layer may have value between a refractive index of the first polarizing plate and a refractive index of the touch unit.

The display device may also include a window provided in the second polarizing plate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
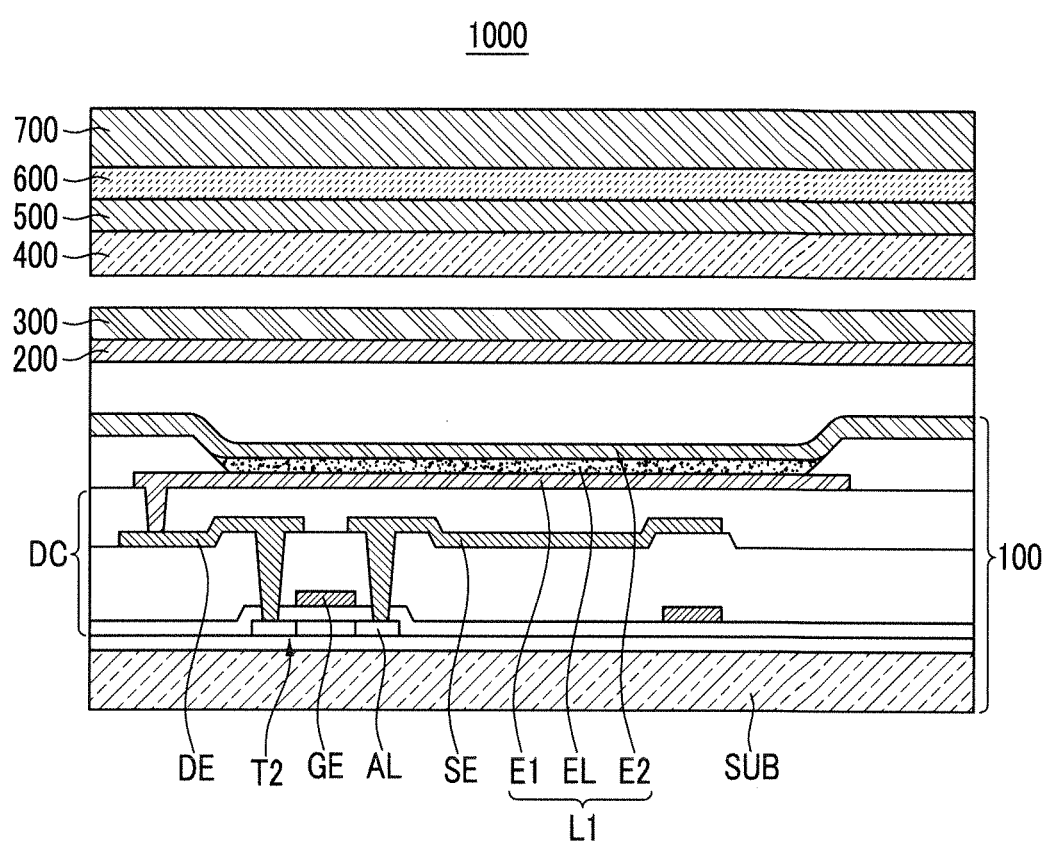
FIG. 1 shows a cross-sectional view of a display device according to a first exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Accordingly, the drawings and description are to be regarded as illustrative in nature and not restrictive, and like reference numerals designate like elements throughout the specification.

In addition, in various exemplary embodiments, the same reference numerals are used with respect to the constituent elements having the same constitution and illustrated in the first exemplary embodiment, and in second, third, and fourth exemplary embodiments, only constitutions that are different from the first exemplary embodiment are illustrated.

In order to clarify layers and regions, thicknesses and sizes thereof are exemplarily illustrated, and thus the present invention is not limited thereto.

In the drawings, the thickness of layers, films, panels, regions, etc., are exaggerated for clarity. In the drawings, for understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element and does not imply being necessarily positioned on the top on the basis of a gravity direction.

Further, the attached drawings illustrate an active matrix (AM) display device having a 2Tr-1 Cap structure in which a pixel has two TFTs and one capacitor, but the present invention is not limited thereto. Therefore, the organic light emitting diode (OLED) display can include at least three thin film transistors and at least two capacitors for each pixel, and can further have an additional wire for various configurations. In this instance, the pixel represents a minimum unit for displaying an image, and the organic light emitting diode (OLED) display expresses the image through a plurality of pixels.

A display device according to a first exemplary embodiment of the present invention will now be described with reference to FIG. 1 to FIG. 4. FIG. 1 shows a cross-sectional view of a display device according to a first exemplary embodiment of the present invention. As shown in FIG. 1, the display device 1000 includes a display unit 100, a first retarder 200, a first polarizing plate 300, a touch unit 400, a second retarder 500, a second polarizing plate 600, and a window 700.

Figure 2:
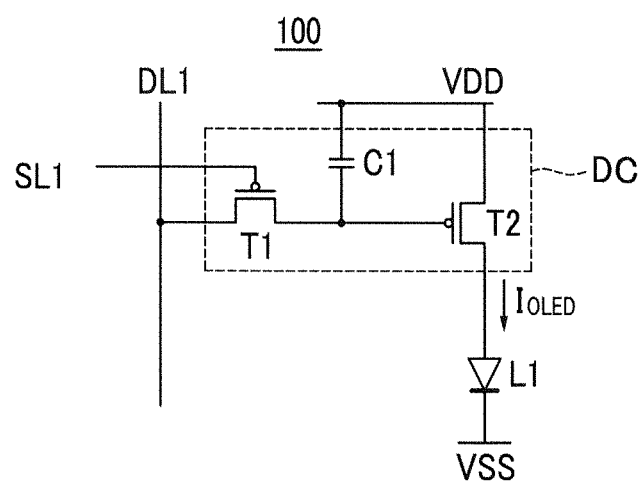
FIG. 2 shows a circuit of a display unit of a display device according to a first exemplary embodiment of the present invention.

The display unit 100 displays an image, and includes a substrate (SUB), a driving circuit (DC), and an organic light emitting element L1. The substrate (SUB) is made of an inorganic material such as glass, a metal material, or an organic material such as resin. The substrate (SUB) can transmit light or block it, and can also be flexible. A scan line SL1, a data line DL1, a drive power supply line VDD, and a common power supply line (VSS) shown in FIG. 2 are formed on the substrate (SUB), and they are connected to the driving circuit (DC). For better understanding and ease of description, a drive thin film transistor T2 is shown in the driving circuit (DC) of the display unit 100 in FIG. 1, and the display unit 100 will now be described in detail with reference to FIG. 2.

Turning now to FIG. 2, FIG. 2 shows a circuit of a display unit of a display device according to a first exemplary embodiment of the present invention. As shown in FIG. 2, the driving circuit (DC) includes a plurality of thin film transistors T1 and T2 and at least one storage capacitor C1. The thin film transistor includes a switching thin film transistor T1 and a drive thin film transistor T2.

The switching thin film transistor T1 is connected to the scan line SL1 and the data line DL1, and transmits a data voltage that is input by the data line DL1 to the drive thin film transistor T2 according to a switching voltage that is input to the scan line SL1. The storage capacitor C1 is connected to the switching thin film transistor T1 and the drive power supply line VDD, and stores a voltage that corresponds to a difference between the voltage provided by the switching thin film transistor T1 and the voltage supplied to the drive power supply line VDD.

The drive thin film transistor T2 is connected to the drive power supply line VDD and the storage capacitor C1 to supply an output current ($I_{OLED}$) that is proportional to a square of a difference between the voltage stored in the storage capacitor C1 and a threshold voltage to the organic light emitting element L1, and the organic light emitting element L1 emits light by the output current ($I_{OLED}$).

Referring now to FIG. 1, the drive thin film transistor T2 includes a source electrode (SE), a drain electrode (DE), a gate electrode (GE), and an active layer (AL). The organic light emitting element L1 includes a first electrode E1, an organic emission layer (EL) formed on the first electrode E1, and a second electrode E2 formed on the organic emission layer (EL), and the first electrode E1, the organic emission layer (EL), and the second electrode E2 are sequentially stacked. In general, the first electrode E1 becomes an anode and the second electrode E2 becomes a cathode, and without being restricted to this, the first electrode E1 can be a cathode and the second electrode E2 can be an anode depending on a driving method. The first electrode E1 of the organic light emitting element L1 is connected to the drain electrode (DE) of the drive thin film transistor T2, and the second electrode E2 is connected to a common power supply line (VSS). At least one of the first electrode E1 and the second electrode E2 is formed to be semi-transmissive or reflective, and thus reflects light.

Also, regarding the display device 1000, the organic light emitting element L1 outputs light in a direction of the second electrode E2 in the organic emission layer (EL) to display an image. That is, the display device 1000 is formed to be a front light emitting type. The driving circuit (DC) and the organic light emitting element L1 are not restricted to the above-noted configuration, and they are variable in many ways by a skilled person in the art.

Further, the display unit 100 of the display device 1000 according to the first embodiment of the present invention substantially represents an organic light emitting diode (OLED) display, and a display unit of a display device according to another exemplary embodiment of the present invention can be a flat panel display such as a liquid crystal display (LCD), a plasma display panel (PDP), or an electrophoretic display.

A first retarder 200 is provided on the display unit 100. The first retarder 200 represents a ¼ wave plate. An optical axis of the first retarder 200 has an angle of (θ+90)+45 degrees. In this instance, the θ degree signifies a predetermined angle, and can be set to be an angle between 0 and 360 degrees. The first retarder 200 circularly polarizes linearly polarized light or linearly polarizes circularly polarized light. An intersection angle between the optical axis of the first retarder 200 and the polarization axis of the first polarizing plate 300 is 45 degrees, and an intersection angle between the optical axis of the first retarder 200 and the optical axis of the second retarder 500 is 90 degrees.

A first polarizing plate 300 is provided on the first retarder 200. The first polarizing plate 300 has a polarization axis of θ+90 degrees, and linearly polarizes light in the polarization axis direction. In detail, the first polarizing plate 300 transmits light that corresponds to the polarization axis, and absorbs light that does not correspond to the polarization axis. Resultantly, the light transmitting through the first polarizing plate 300 is linearly polarized in the polarization axis direction.

A touch unit 400 is provided on the first polarizing plate 300, and a predetermined space is provided between the first polarizing plate 300 and the touch unit 400. The space is formed by attaching the first retarder 200 and the first polarizing plate 300 to the display unit 100 and disposing the display unit 100 on the first polarizing plate 300.

The touch unit 400 can be a capacitive touch panel, and wires that are configured for a capacitor of the insulation layer to sense a change formed in the touch unit 400. Various forms of the wires and the insulation layer configuring the touch unit 400 are known to a person skilled in the art, so no detailed description thereof will be provided.

A second retarder 500 is provided in the touch unit 400. The second retarder 500 represents a ½ wave plate, and the optical axis of the second retarder 500 has an angle of θ+45 degrees. The second retarder 500 shifts the optical axis of the linearly polarized light by 90 degrees. The intersection angle between the optical axis of the second retarder 500 and the optical axis of the first retarder 200 is 90 degrees.

A second polarizing plate 600 is provided on the second retarder 500. The second polarizing plate 600 has the polarization axis of θ degrees, and linearly polarizes light in the polarization axis direction. In detail, the second polarizing plate 600 transmits the light that corresponds to the polarization axis and absorbs the light that does not correspond to the polarization axis. Hence, the light transmitting through the second polarizing plate 600 is linearly polarized in the polarization axis direction. The intersection angle between the polarization axis of the second polarizing plate 600 and the polarization axis of the first polarizing plate 300 is 90 degrees.

A window 700 is provided on the second polarizing plate 600, and the second retarder 500 and the second polarizing plate 600 can be attached to the touch unit 400 or the window 700. The window 700 is made of a transparent material such as glass or resin, and it protects the display unit 100 and the touch unit 400 so that display unit 100 and touch unit 400 are not damaged by impact. The window 700 faces the display unit 100 and the touch unit 400 and covers the touch unit 400 and the display unit 100. The window 700 can be formed to be wider than the touch unit 400 and the display unit 100, and without being restricted to this, it can be formed to be substantially equivalent to the touch unit 400 and the display unit 100 in size.

According to the above-noted configuration, the display device 1000 improves visibility by controlling reflection of external light caused by the touch unit 400 and the display unit 100 and minimizes a loss of light that is produced by the display unit 100 and is output to the outside of the display unit 100. As a result, display characteristics of the display device 1000 can be improved.

A method for a display device 1000 according to the first exemplary embodiment of the present invention to efficiently control reflection of external light and minimize a loss of light produced by display unit 100 and provided to the outside of display device 1000 will now be described with reference to FIGS. 3 and 4.

Figure 3:
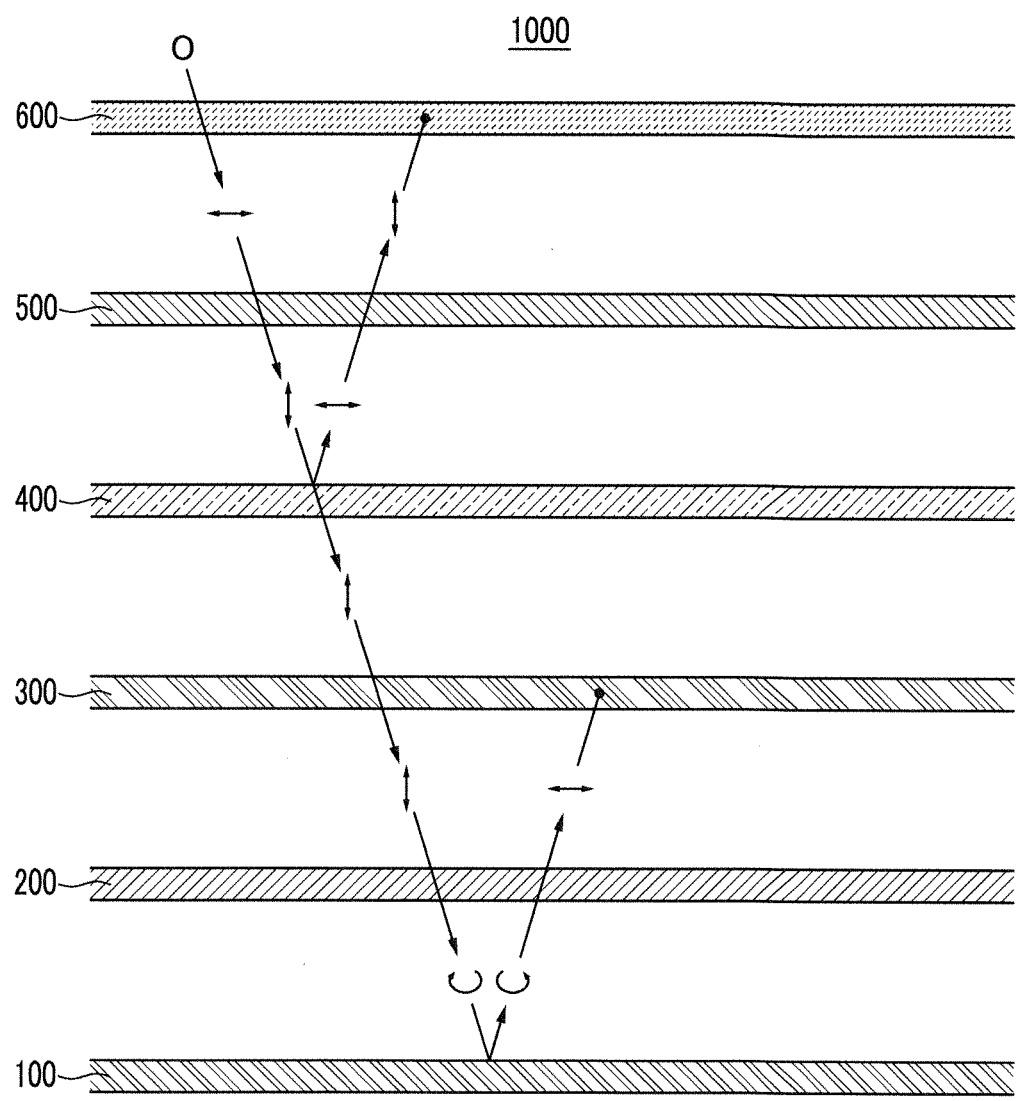
FIG. 3 shows suppression of reflection of external light of a display device according to a first exemplary embodiment of the present invention.

Turning now to FIG. 3, FIG. 3 shows suppression of reflection of external light of a display device according to a first exemplary embodiment of the present invention. For ease of description, the degree θ in FIG. 3 is set to be 0, and it can also be set to have a value between 0 and 360 degrees.

As shown in FIG. 3, external light is transmitted through the second polarizing plate 600 and is linearly polarized at an angle of θ that is the polarization axis direction of the second polarizing plate 600. The linearly polarized light is transmitted through the second retarder 500, which is a ½ wave plate, to maintain the linearly polarized state, and is be rotated by 90 degrees, to result in light having an optical axis of θ+90 degrees. In this instance, the optical axis of the second retarder 500 is rotated by 45 degrees with respect to the polarization axis of the second polarizing plate 600. That is, the intersection angle between the optical axis of the second retarder 500 and the polarization axis of the second polarizing plate 600 is 45 degrees.

Next, the linearly polarized light with the optical axis of θ+90 degrees is reflected from the touch unit 400 or transmitted through the touch unit 400. In this instance, when the light is reflected by the touch unit 400, its optical axis is changed, and then the reflected light is transmitted through the second retarder 500 where it is rotated by 90 degrees, and it is then absorbed into the second polarizing plate 600. When the light reflected by the touch unit 400 is absorbed by the second polarizing plate 600, reflection of external light caused by the touch unit 400 is controlled.

Also, the linearly polarized light having been transmitted through the touch unit 400 has the optical axis of θ+90 degrees that is the polarization axis direction of the first polarizing plate 300, thereby transmitting through the first polarizing plate 300. The linearly polarized light having been transmitted through the first polarizing plate 300 and having the optical axis of θ+90 degrees is transmitted through the first retarder 200, a ¼ wave plate, and is then right circularly polarized. In this instance, the optical axis of the first retarder 200 is rotated by 45 degrees compared to the polarization axis of the first polarizing plate 300. That is, the intersection angle between the optical axis of the first retarder 200 and the polarization axis of the first polarizing plate 300 is 45 degrees.

The right circularly polarized light is reflected by the display unit 100 to be changed into left circularly polarized light, is transmitted through the first retarder 200 to be linearly polarized, and is then absorbed into the first polarizing plate 300. The light reflected by the display unit 100 is absorbed into the first polarizing plate 300 to control reflection of external light caused by the display unit 100.

According to the above-noted configuration, most of the external light irradiated into the display device 1000 is absorbed by the first polarizing plate 300 and the second polarizing plate 600 so the display device 1000 can improve the visibility by efficiently controlling the reflection of external light.

Figure 4:
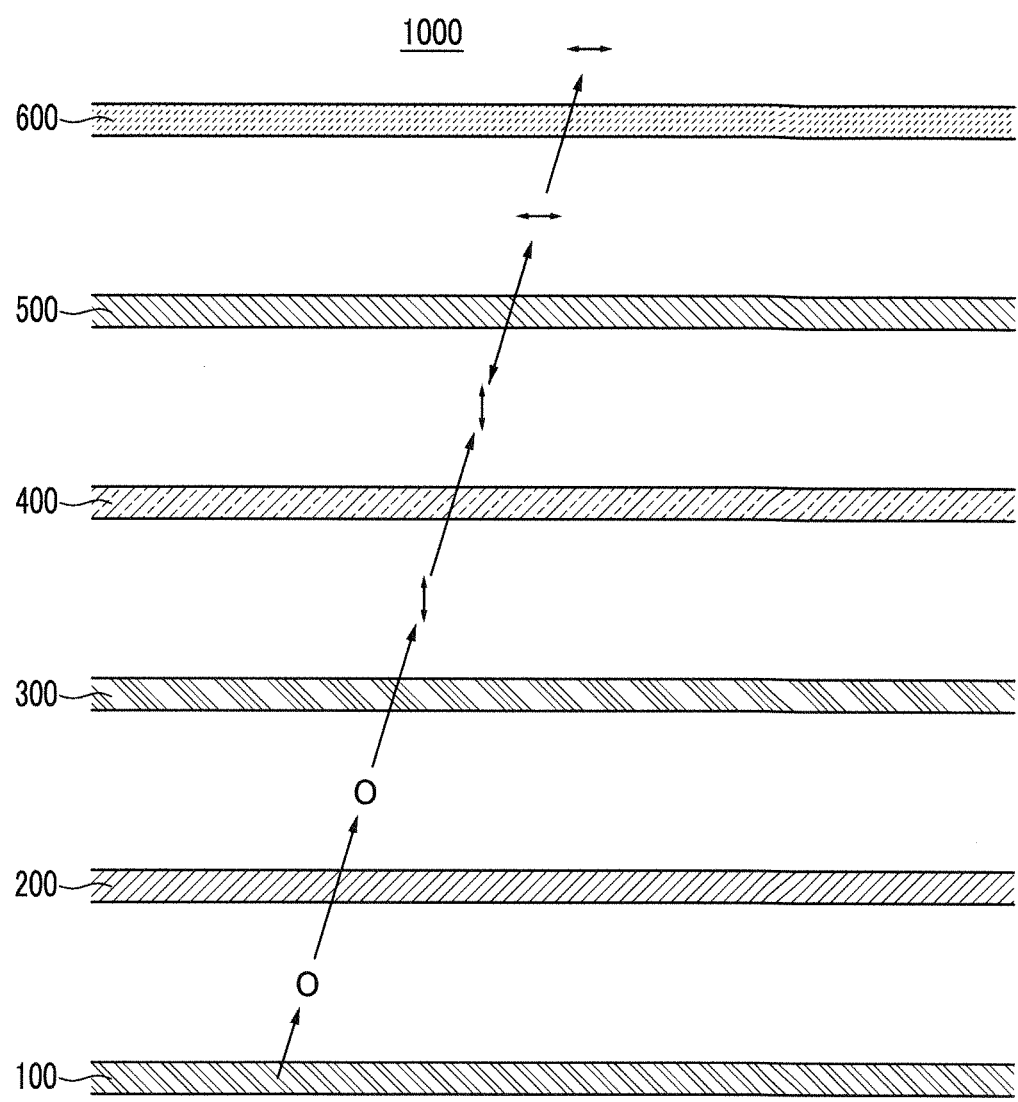
FIG. 4 shows a path for light generated by a display unit of a display device according to a first exemplary embodiment of the present invention to be provided to the outside.

Turning now to FIG. 4, FIG. 4 shows a path for light generated by a display unit of a display device according to a first exemplary embodiment of the present invention to be provided to the outside. As shown in FIG. 4, in the display unit 100, light is transmitted through the first retarder 200. The light in this instance has various phases that are mixed therein.

The light having been transmitted through the first retarder 200 is transmitted through the first polarizing plate 300 and is then linearly polarized by θ+90 degrees, which is the polarization axis direction of the first polarizing plate 300. The linearly polarized light is transmitted through the touch unit 400 and the second retarder 500, a ½ wave plate, maintains the linearly polarized state, is rotated by 90 degrees, and has the optical axis of θ+180 degrees.

The light with the optical axis of θ+180 degrees is transmitted through the second polarizing plate 600 with the polarization axis of θ degrees, the substantially equivalent optical axis, and is then viewed to the outside.

According to the above-noted configuration, the light generated by the display unit 100 is transmitted through the second polarizing plate 600 and is then drawn to the outside. That is, the display device 1000 can efficiently discharge the light generated by the display unit 100 to the outside, thereby reducing power consumption and improving the life-span thereof.

As described, the display device 1000 according to the first exemplary embodiment of the present invention improves visibility by efficiently controlling the reflection of external light caused by the touch unit 400 and the display unit 100, and minimizes the loss of light discharged to the outside from the display unit 100. That is, when the touch unit 400 and the display unit 100 are included, the display device 1000 controlling reflection of external light is provided.

A display device according to a second exemplary embodiment of the present invention will now be described with reference to FIG. 5 to FIG. 7. Parts that are different from the first exemplary embodiment will be described. For better comprehension and ease of description, the constituent elements corresponding to the first exemplary embodiment of the present invention will have the same reference numerals in the second exemplary embodiment of the present invention.

Figure 5:
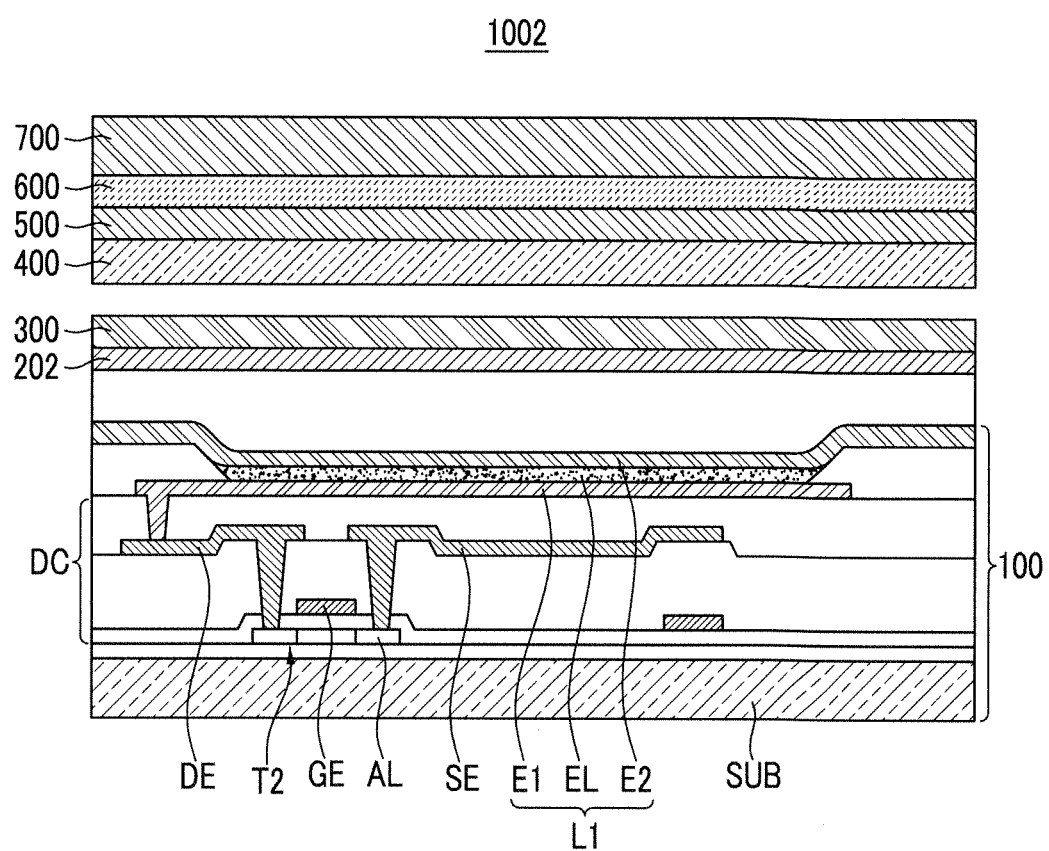
FIG. 5 shows a cross-sectional view of a display device according to a second exemplary embodiment of the present invention.

Turning now to FIG. 5, FIG. 5 shows a cross-sectional view of a display device according to a second exemplary embodiment of the present invention. As shown in FIG. 5, a display device 1002 includes a display unit 100, a first retarder 202, a first polarizing plate 300, a touch unit 400, a second retarder 500, a second polarizing plate 600, and a window 700.

The first retarder 202 represents a ¼ wave plate. The optical axis of the first retarder 202 has an angle of (θ+90)−45 degrees. The first retarder 202 circularly polarizes the linearly polarized light or linearly polarizes the circularly polarized light. The intersection angle between the optical axis of the first retarder 202 and the polarization axis of the first polarizing plate 300 is −45 degrees, and the intersection angle between the optical axis of the first retarder 202 and the optical axis of the second retarder 500 is 0 degrees.

According to the above-noted configuration, the display device 1002 can improve visibility by efficiently controlling reflection of external light caused by the touch unit 400 and the display unit 100 and minimizes the loss of light provided to the outside from the display unit 100. That is, the display characteristic of the display device 1002 can be improved.

A method for a display device 1002 according to a second exemplary embodiment of the present invention to efficiently control reflection of external light and minimize loss of light provided to the outside from a display unit 100 will now be described with reference to FIGS. 5 and 6.

Figure 6:
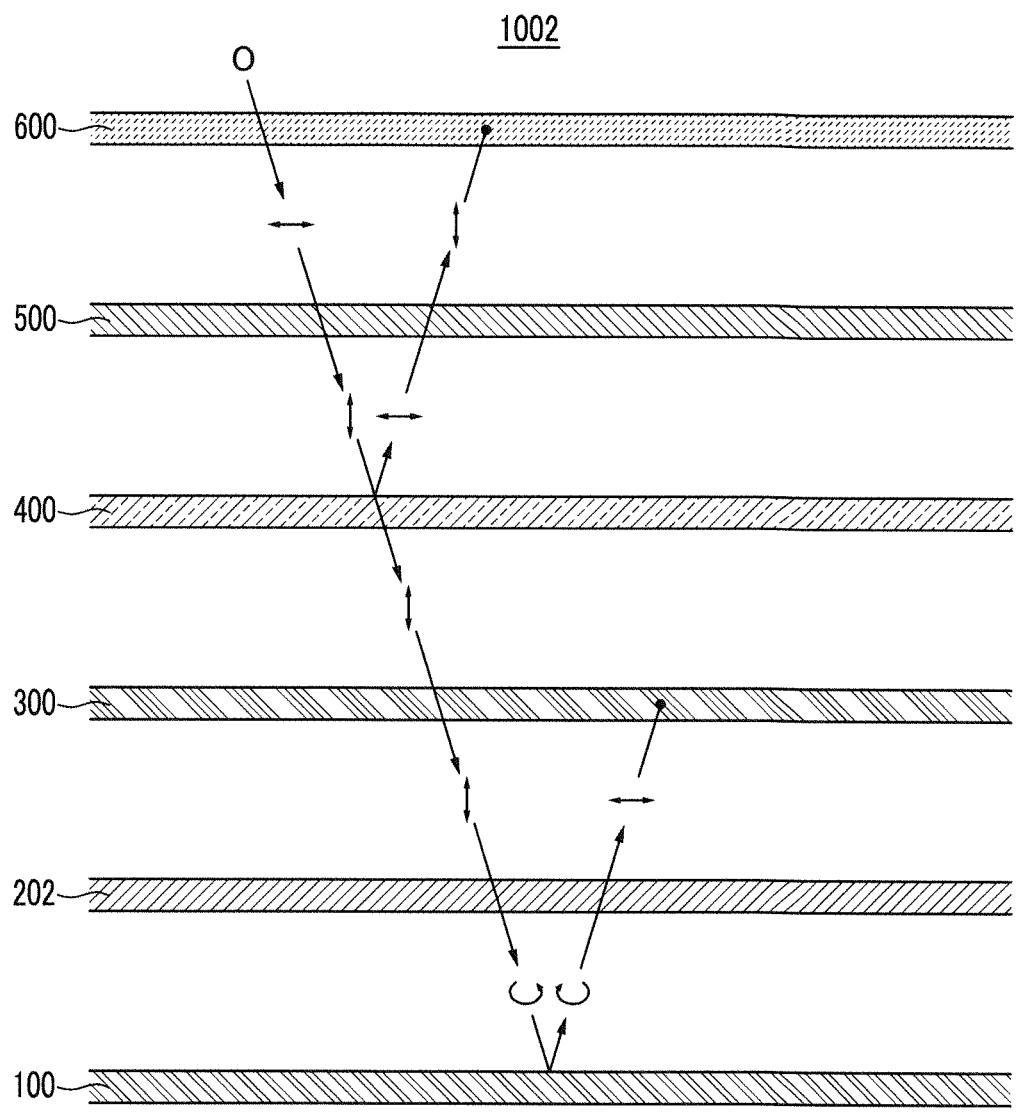
FIG. 6 shows control of reflection of external light by a display device according to a second exemplary embodiment of the present invention.

Turning now to FIG. 6, FIG. 6 shows control of reflection of external light by a display device according to a second exemplary embodiment of the present invention. As shown in FIG. 6, external light is transmitted through the second polarizing plate 600 and is linearly polarized by θ degrees in the polarization axis direction of the second polarizing plate 600. The linearly polarized light is transmitted through the second retarder 500, a ½ wave plate, maintains the linearly polarized state, is rotated by 90 degrees, and it has the optical axis of θ+90 degrees. In this instance, the optical axis of the second retarder 500 is rotated by 45 degrees compared to the polarization axis of the second polarizing plate 600. That is, the intersection angle between the optical axis of the second retarder 500 and the polarization axis of the second polarizing plate 600 is 45 degrees.

The linearly polarized light with the optical axis of θ+90 degrees is reflected from the touch unit 400 or transmits through the touch unit 400. In this instance, for the light reflected by the touch unit 400, its optical axis is changed, it is transmitted through the second retarder 500, it is rotated by 90 degrees, and it is absorbed into the second polarizing plate 600. As described above, the light reflected by the touch unit 400 is absorbed by the second polarizing plate 600 so that reflection of external light caused by the touch unit 400 is controlled.

For the linearly polarized light having been transmitted through the touch unit 400, this light also has an optical axis of θ+90 degrees, that is, the polarization axis direction of the first polarizing plate 300 from being transmitted through the first polarizing plate 300. The linearly polarized light having been transmitted through the first polarizing plate 300 and having the optical axis of θ+90 degrees is transmitted through the first retarder 202, a ¼ wave plate, and is left circularly polarized. In this instance, the optical axis of the first retarder 202 is rotated by −45 degrees compared to the polarization axis of the first polarizing plate 300. That is, the intersection angle between the optical axis of the first retarder 202 and the polarization axis of the first polarizing plate 300 is −45 degrees.

The left circularly polarized light is reflected by the display unit 100 is changed to be right circularly polarized light, and this light is then transmitted through the first retarder 202 to be linearly polarized, and is then absorbed into the first polarizing plate 300. As described above, the light reflected by the display unit 100 is absorbed into the first polarizing plate 300, so reflection of external light caused by the display unit 100 is controlled.

According to the above-noted configuration, most of the external light irradiated into the display device 1002 is absorbed by the first polarizing plate 300 and the second polarizing plate 600, so the display device 1002 can efficiently control the reflection of external light to improve visibility.

Figure 7:
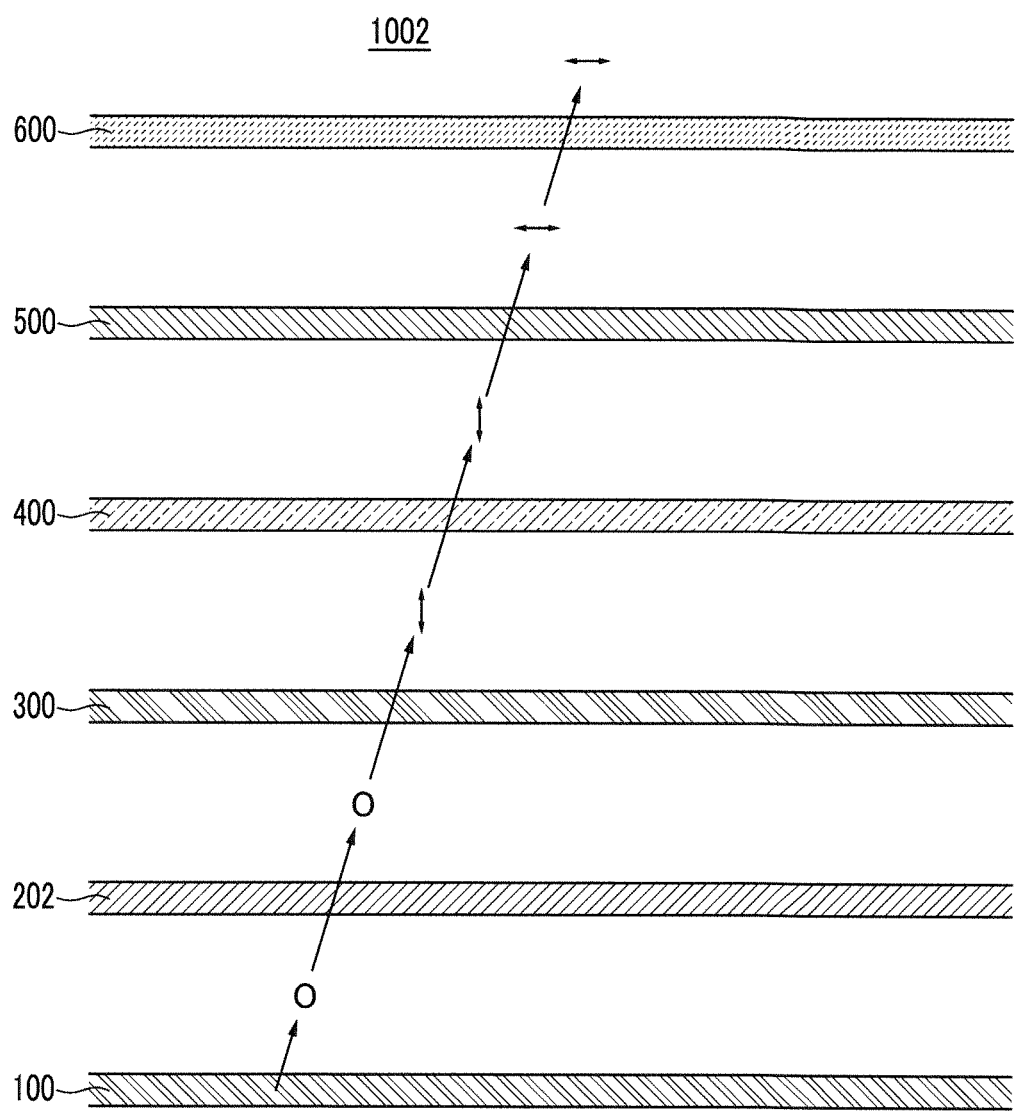
FIG. 7 shows a path for light generated by a display unit of a display device according to a second exemplary embodiment of the present invention to be provided to the outside.

Turning now to FIG. 7, FIG. 7 shows a path for light generated by a display unit of a display device according to the second exemplary embodiment of the present invention to be provided to the outside. As shown in FIG. 7, the light transmits through the first retarder 202 in the display unit 100. The light in this case has various phases mixed with each other.

The light having transmitted through the first retarder 202 transmits through the first polarizing plate 300 and is linearly polarized by θ+90 degrees, the polarization axis direction of the first polarizing plate 300. The linearly polarized light is transmitted through the touch unit 400 and the second retarder 500, a ½ wave plate, maintains the linearly polarized state, is rotated by 90 degrees, and has the optical axis of θ+180 degrees.

The light with the optical axis of θ+180 degrees is transmitted through the second polarizing plate 600 with the polarization axis of θ degrees that is substantially an equivalent optical axis.

According to the above-noted configuration, the light generated by the display unit 100 is transmitted through the second polarizing plate 600 to be viewed on the outside. That is, the display device 1002 can efficiently discharge the light generated by the display unit 100 to the outside, thereby reducing power consumption and improving the life-span thereof.

As described, the display device 1002 according to the second exemplary embodiment of the present invention efficiently controls the reflection of external light caused by the touch unit 400 and the display unit 100 to improve visibility, and minimizes the loss of light discharged to the outside from the display unit 100. That is, when the touch unit 400 and the display unit 100 are included, the display device 1002 for controlling reflection of external light is provided.

A display device according to a third exemplary embodiment of the present invention will now be described with reference to FIG. 8. Parts that are different from the first exemplary embodiment will be described, and portions that are not described follow the first exemplary embodiment. For better comprehension and ease of description, in the third exemplary embodiment of the present invention, the same constituent elements will have the same reference numerals as the first exemplary embodiment of the present invention.

Figure 8:
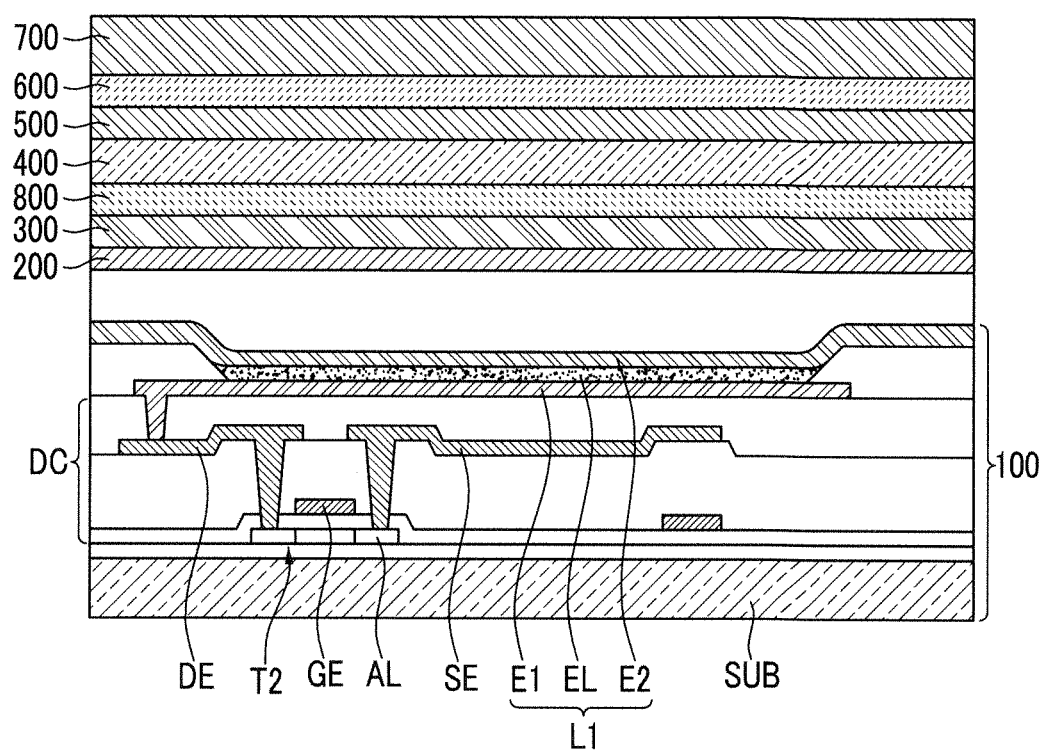
FIG. 8 shows a cross-sectional view of a display device according to a third exemplary embodiment of the present invention.

Turning now to FIG. 8, FIG. 8 shows a cross-sectional view of a display device according to a third exemplary embodiment of the present invention. As shown in FIG. 8, a display device 1003 includes a display unit 100, a first retarder 200, a first polarizing plate 300, a touch unit 400, a second retarder 500, a second polarizing plate 600, a window 700, and an adhesive layer 800.

The adhesive layer 800 is provided between the first polarizing plate 300 and the touch unit 400. No empty space is formed between the first polarizing plate 300 and the touch unit 400 due to the adhesive layer 800. A refractive index of the adhesive layer 800 has a value between the refractive index of the first polarizing plate 300 and the refractive index of the touch unit 400.

Resultantly, reflection caused by a refractive index difference on an interface between the first polarizing plate 300 and the adhesive layer 800 and an interface between the adhesive layer 800 and the touch unit 400 is minimized, thereby improving the display characteristic of the display device 1003.

As described, the display device 1003 according to the third exemplary embodiment of the present invention improves visibility by efficiently controlling the reflection of external light caused by the touch unit 400 and the display unit 100, minimizes the loss of light discharged to the outside from the display unit 100, and minimizes reflection generated in the space formed between the first polarizing plate 300 and the touch unit 400 of the display device 1000 according to the first exemplary embodiment and the display device 1002 according to the second exemplary embodiment.

That is, when the touch unit 400 and the display unit 100 are included, reflection of external light is controlled and the display device 1003 with improved image quality is provided.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
   a display unit to display an image, the display unit having a first side and a second and opposite side, the image being viewed from the first side;
   a first retarder arranged on the display unit;
   a first polarizing plate arranged on the first retarder;
   a touch unit arranged on the first polarizing plate;
   a second retarder arranged on the touch unit; and
   a second polarizing plate arranged on the second retarder, the first retarder, wherein the first polarizing plate, the touch unit, the second retarder and the second polarizing plate are sequentially stacked on the first side of the display unit, and wherein the first retarder is closer to the display unit than the first polarizing plate and the second polarizing plate.

2. The display device of claim 1, wherein the display unit includes a first electrode, an organic emission layer, and a second electrode that are sequentially stacked.

3. The display device of claim 1, wherein the first retarder is a ¼ wave plate, and the second retarder is a ½ wave plate.

4. The display device of claim 3, wherein
   an intersection angle between a polarization axis of the second polarizing plate and a polarization axis of the first polarizing plate is 90 degrees,
   an intersection angle between an optical axis of the second retarder and an optical axis of the first retarder is 90 degrees, and
   an intersection angle between the optical axis of the first retarder and the polarization axis of the first polarizing plate is 45 degrees.

5. The display device of claim 4, wherein
   the polarization axis of the second polarizing plate is a predetermined θ degrees,
   the optical axis of the second retarder has an angle of (θ+45) degrees,
   the polarization axis of the first polarizing plate has an angle of (θ+90) degrees, and
   the optical axis of the first retarder has an angle of (θ+90)+45 degrees.

6. The display device of claim 3, wherein
   an intersection angle between a polarization axis of the second polarizing plate and a polarization axis of the first polarizing plate is 90 degrees,
   an intersection angle between an optical axis of the second retarder and an optical axis of the first retarder is 0 degrees, and
   an intersection angle between an optical axis of the first retarder and a polarization axis of the first polarizing plate is −45 degrees.

7. The display device of claim 6, wherein
   the polarization axis of the second polarizing plate is a predetermined θ degrees,
   the optical axis of the second retarder has an angle of (θ+45) degrees,
   the polarization axis of the first polarizing plate has an angle of (θ+90) degrees, and
   the optical axis of the first retarder has an angle of (θ+90)−45 degrees.

8. The display device of claim 3, further comprising an adhesive layer arranged between the first polarizing plate and the touch unit.

9. The display device of claim 8, wherein a refractive index of the adhesive layer has a value between a refractive index of the first polarizing plate and a refractive index of the touch unit.

10. The display device of claim 1, further comprising a window arranged on the second polarizing plate.

11. The display device of claim 1, the touch unit being spaced-apart from the first polarizing, plate by a gap.

12. The display device of claim 1, wherein the touch unit transmits a portion of external light that enters the display device and reflects a remaining portion of external light that enters the display device.

13. The display device of claim 12, wherein the portion of the external light that enters the display device and is transmitted through the touch unit is reflected off the display unit and is again transmitted through the touch unit to be absorbed by the second polarizing plate.

14. The display device of claim 12, wherein the portion of the external light that enters the display device and is reflected off the touch unit is absorbed by the second polarizing plate.

15. The display device of claim 1, the display unit being an organic light emitting diode display unit.

16. The display device of claim 1, the display device being adapted to absorb all external light that enters the display device, including light reflected off the touch unit and light transmitted through the touch unit and reflected off the display unit.

17. A display device, comprising:
- a display unit to display an image, the display unit having a first side and a second and opposite side, the image being viewed from the first side;
- a first retarder arranged on the display unit, the first retarder being a ¼ wave plate;
- a first polarizing plate arranged on the first, retarder;
- a touch unit arranged on the first polarizing plate;
- a second retarder arranged on the touch unit, the second retarder being a ½ wave plate; and
- a second polarizing plate arranged on the second retarder, the first retarder, the first polarizing plate, the touch unit, the second retarder and the second polarizing plate each being arranged on the first side only of the display unit,
- wherein the first retarder is interposed between the display unit and the first polarizing plate.

18. The display device of claim 17, the display unit being an organic light emitting diode display unit.

19. The display device of claim 17, the second polarizing plate to absorb both external light that enters the display device and reflects off the touch unit and external light that enters the display device and transmits through the touch unit and reflects off the display unit.

20. The display device of claim 17, further comprising an adhesive layer arranged between the first polarizing plate and the touch unit to directly attach the first polarizing plate to the touch unit, wherein a refractive index of the adhesive layer has a value between a refractive index of the first polarizing plate and a refractive index of the touch unit.

* * * * *